United States Patent
Law

(10) Patent No.: US 7,858,402 B2
(45) Date of Patent: Dec. 28, 2010

(54) INTEGRATED CIRCUIT PACKAGE HAVING REVERSIBLE ESD PROTECTION

(75) Inventor: Edmund Law, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 134 days.

(21) Appl. No.: 11/946,509

(22) Filed: Nov. 28, 2007

(65) Prior Publication Data

US 2009/0134902 A1 May 28, 2009

(51) Int. Cl.
*G01R 31/26* (2006.01)
(52) U.S. Cl. .................................................... 438/14
(58) Field of Classification Search .................. 438/14; 257/546, 758; 324/452
See application file for complete search history.

(56) References Cited

U.S. PATENT DOCUMENTS

| | | | |
|---|---|---|---|
| 2004/0108577 A1* | 6/2004 | Okamoto | 257/659 |
| 2004/0183167 A1* | 9/2004 | Hortaleza et al. | 257/666 |
| 2007/0235849 A1* | 10/2007 | Othieno et al. | 257/678 |
| 2007/0251720 A1* | 11/2007 | Wright | 174/255 |
| 2009/0066354 A1* | 3/2009 | Gaertner et al. | 324/763 |

* cited by examiner

*Primary Examiner*—Ha Tran T Nguyen
*Assistant Examiner*—Shaun Campbell
(74) *Attorney, Agent, or Firm*—Fiala & Weaver P.L.L.C.

(57) ABSTRACT

Methods, systems, and apparatuses are provided for integrated circuit packages and for enabling electrostatic discharge (ESD) testing of the same. A package includes an integrated circuit chip, a substrate, a first electrically conductive trace, and a second electrically conductive trace. The substrate includes a first electrically conductive region and a second electrically conductive region. The first region is coupled to a first ground signal of the chip, and the second region is coupled to a second ground signal of the chip. The first trace is coupled to the first region and the second trace is coupled to the second region. A portion of the first trace is proximate to a portion of the second trace. An electrically conductive material may be deposited to electrically couple the first and second traces to enable ESD protection testing of the package.

22 Claims, 7 Drawing Sheets

104

INTEGRATED CIRCUIT PACKAGE HAVING REVERSIBLE ESD PROTECTION

BACKGROUND OF THE INVENTION

1. Field of the Invention

The present invention relates to integrated circuit packaging technology, and more particularly, to electrostatic discharge protection for integrated circuits.

2. Background Art

Integrated circuit (IC) chips or dies from semiconductor wafers are typically interfaced with other circuits using a package that can be attached to a printed circuit board (PCB). One such type of IC die package is a ball grid array (BGA) package. BGA packages provide for smaller footprints than many other package solutions available today. A BGA package has an array of solder ball pads located on a bottom external surface of a package substrate. Solder balls are attached to the solder ball pads. The solder balls are reflowed to attach the package to the PCB.

Millions of BGA packages are manufactured each year for implementation in electronic devices according to increasingly finer fabrication technologies, including 90 nm and 65 nm technologies. Such BGA packages undergo rigorous testing during various phases of their design and/or assembly processes. For example, customers may require that a particular BGA package design pass electrostatic discharge (ESD) protection testing. Such ESD testing is performed to determine that the integrated circuit of the BGA package is not damaged by an electrostatic discharge of a particular test discharge amount. It is desirable to perform the ESD protection testing with the BGA package attached to the circuit board designed to mount the BGA package in a commercial product. This is because electrical characteristics of the BGA package are altered when mounted to the circuit board, thereby altering the ESD sensitivity. Thus, an ESD test performed on the BGA package when attached to the circuit board is a more representative test.

However, in some situations, it may not be practical to perform the ESD testing with the BGA package mounted to the circuit board. For example, the circuit board may not yet be designed, the circuit board may not be available to the BGA package manufacturer, and/or further reasons may make such ESD testing impractical. Thus, in some situations, it may not be possible or practical to perform ESD testing of a BGA package in a manner that verifies ESD protection for the package in its actual operating environment.

Therefore, what are needed are ways of performing ESD testing on a BGA package in a manner similar to its actual operating environment.

BRIEF SUMMARY OF THE INVENTION

Methods, systems, and apparatuses are provided for integrated circuit packages, and for electrostatic discharge (ESD) testing of the same. In a first aspect, an integrated circuit package is formed. A substrate of the package is formed to have a first electrically conductive region configured for a first ground signal and a second electrically conductive region configured for a second ground signal. The first electrically conductive region is electrically isolated from the second electrically conductive region. A first trace is formed that is coupled to the first electrically conductive region. A second trace is formed that is coupled to the second electrically conductive region. A portion (e.g., an end portion) of the first trace is proximate to a portion (e.g., an end portion) of the second trace. ESD protection for the package is enabled by electrically coupling the first trace to the second trace.

For example, an electrically conductive material may be applied to the substrate to electrically couple the first and second traces, to enable the ESD protection. In an example aspect, an opening may be formed in a solder mask material on the substrate to enable a solder material to be deposited on to the substrate to provide the electrical coupling. Subsequent to enabling the ESD protection, the package may undergo ESD testing. After ESD testing, the electrically conductive material may be removed, if desired.

In another aspect, an integrated circuit package is provided. The package includes an integrated circuit chip, a substrate, a first electrically conductive trace, and a second electrically conductive trace. A first substrate layer includes a plurality of electrically conductive features. The substrate further includes a first electrically conductive region and a second electrically conductive region. The first electrically conductive region is coupled to a first ground signal of the chip, and the second electrically conductive region is coupled to a second ground signal of the chip. The first trace is coupled to the first electrically conductive region and the second trace is coupled to the second electrically conductive region. A portion of the first trace is proximate to a portion of the second trace. An electrically conductive material may be deposited to the substrate to electrically couple the first and second traces to enable ESD protection testing of the package.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
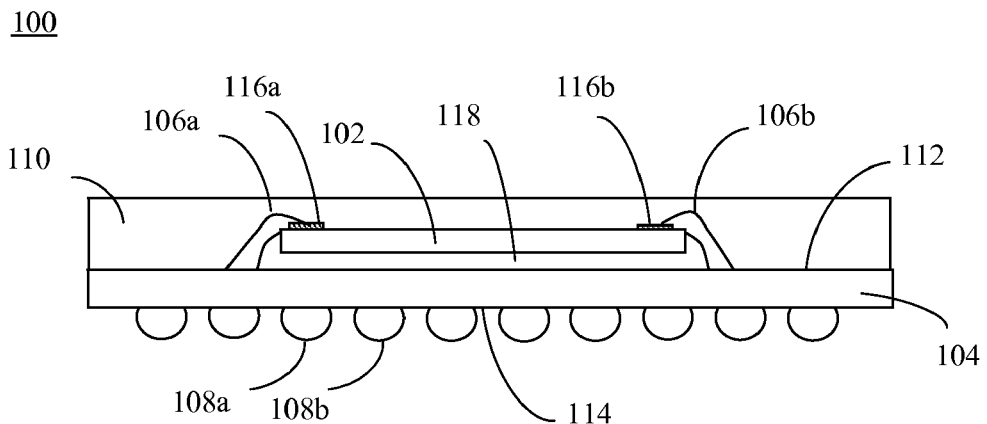
FIG. 1 shows a cross-sectional side view of an example BGA package.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Example Integrated Circuit Packages

Embodiments of the present invention are applicable to a variety of types of integrated circuit packages, including ball grid array (BGA) packages. FIG. 1 shows a cross-sectional view of an example BGA package 100. BGA package 100 may be a plastic BGA (PBGA) package, a flex BGA package, a ceramic BGA package, a fine pitch BGA (FPBGA or FBGA) package, or other type of BGA package. BGA package 100 includes an integrated circuit die/chip 102, a substrate 104, bond wires (also known as "wire bonds") 106, a plurality of solder balls 108, and an encapsulating material 110. Substrate 104 has a first (e.g., top) surface 112 that is opposed to a second (e.g., bottom) surface 114 of substrate 104. As shown in FIG. 1, die 102 is mounted to first surface 112 of substrate 104. Die 102 may be mounted to substrate 104 using an adhesive material 118.

As shown in FIG. 1, a plurality of bond wires 106 are coupled between terminals 116 of die 102 and electrically conductive features, such as traces, bond fingers, etc. (not shown in FIG. 1), at first surface 112 of substrate 104. For example, a first bond wire 106a is connected between a terminal 116a and first surface 112 of substrate 104, and a second bond wire 106b is connected between a terminal 116b and first surface 112 of substrate 104. Any number of bond wires 106 may be present, depending on a number of signals (at terminals 116) of die 102 to be coupled to conductive features of first surface 112 of substrate 104. Bond wires 106 may be wires formed of any suitable electrically conductive material, including a metal such as gold, silver, copper, aluminum, other metal, or combination of metals/alloy. Bond wires 106 may be attached according to wire bonding techniques and mechanisms well known to persons skilled in the relevant art(s).

As further shown in FIG. 1, encapsulating material 110 covers die 102 and bond wires 106 on first surface 112 of substrate 104. Encapsulating material 110 protects die 102 and bond wires 106 from environmental hazards. Encapsulating material 110 may be any suitable type of encapsulating material, including an epoxy, a mold compound, etc. Encapsulating material 110 may be applied in a variety of ways, including by a saw singulation technique, injection into a mold, etc.

Figure 2:
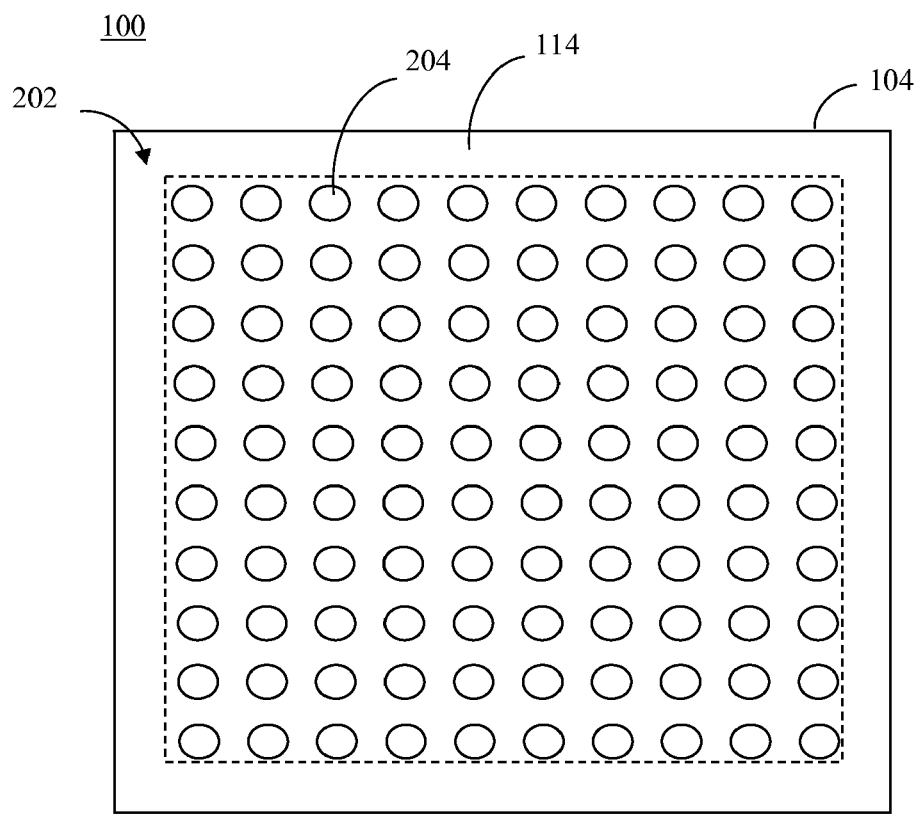
FIG. 2 shows a bottom view of the BGA package of FIG. 1.

A plurality of solder balls 108 (including solder balls 108a and 108b indicated in FIG. 1) is attached to second surface 114 of substrate 104. FIG. 2 shows a plan (bottom) view of second surface 114 of substrate 104. Solder balls 108 are not shown in FIG. 2. Instead, in FIG. 2, second surface 114 of substrate 104 includes an array 202 of solder balls pads 204. In the example of FIG. 2, array 202 includes one hundred solder ball pads 204 arranged in a 10 by 10 array. In other implementations, array 202 may include fewer or greater numbers of solder ball pads 204 arranged in any number of rows and columns. Solder ball pads 204 are attachment locations for solder balls 108 (shown in FIG. 1) on package 100. Solder ball pads 204 are electrically coupled through substrate 104 (e.g., by electrically conductive vias and/or routing) to the electrically conductive features (e.g., traces, bond fingers, contact regions, etc.) of first surface 112 of substrate 104 to enable signals of die 102 to be electrically connected to solder balls 108. Note that FIG. 2 shows a full array of solder ball pads 204. In some embodiments, array 202 of solder ball pads 204 may be missing some pads 204, so that array 202 is not necessarily a full array of solder balls 108 on second surface 114.

Substrate 104 may include one or more electrically conductive layers (such as at first surface 112) that are separated by one or more electrically insulating layers. An electrically conductive layer may include traces/routing, bond fingers, contact pads, and/or other electrically conductive features. For example, BGA substrates having one electrically conductive layer, two electrically conductive layers, or four electrically conductive layers are common. The electrically conductive layers may be made from an electrically conductive material, such as a metal or combination of metals/alloy, including copper, aluminum, tin, nickel, gold, silver, etc. In embodiments, substrate 104 may be rigid or may be flexible (e.g., a "flex" substrate). The electrically insulating layer(s) may be made from ceramic, plastic, tape, and/or other suitable materials. For example, the electrically insulating layer(s) of substrate 104 may be made from an organic material such as BT (bismaleimide triazine) laminate/resin, a flexible tape material such as polyimide, a flame retardant fiberglass composite substrate board material (e.g., FR-4), etc. The electrically conductive and non-conductive layers can be stacked and laminated together, or otherwise attached to each other, to form substrate 104, in a manner as would be known to persons skilled in the relevant art(s).

Other configurations for BGA package 100 are within the scope of embodiments of the present invention. For example, package 100 in FIG. 1 is a die-up type BGA package. Alternatively, package 100 may be configured as a die-down BGA package, where die 102 is mounted to a bottom surface of package 100. Furthermore, package 100 may include heat spreaders and/or heat sinks configured to spread heat within and/or outside package 100.

BGA packages, such as BGA package 100, undergo rigorous testing during various phases of their design and/or assembly processes. For example, BGA package 100 may be required to pass electrostatic discharge (ESD) protection testing. Such ESD testing may be performed to determine whether circuitry of die 102 can withstand electrostatic discharges in an operating environment. It may be desirable to perform the ESD protection testing with BGA package 100 attached to a circuit board designed to mount BGA package 100 in an end product. This is because electrical characteristics of BGA package 100 may change when mounted to the circuit board, thereby altering ESD sensitivity of BGA package 100. For example, the circuit board may couple together ground signals of the BGA package 100.

However, in some situations, it may not be practical to perform the ESD testing with BGA package 100 mounted to such a circuit board. For example, such a circuit board may not yet be designed and/or manufactured, the circuit board may not be available to manufacturer of BGA package 100, or other reason(s). Thus, in some situations, it may not be possible or practical to perform ESD testing of BGA package 100 in a manner that verifies ESD protection for package 100 in its actual operating environment.

Embodiments of the present invention overcome the necessity for attaching integrated circuit packages to end circuit boards to fully verify ESD protection. Example embodiments are further described in the following section.

Example Embodiments

The example embodiments described herein are provided for illustrative purposes, and are not limiting. Although described with reference to BGA packages, the examples described herein may be adapted to various types of integrated circuit packages, including other land grid array (LGA) package types, pin grid array (PGA) packages, and further types of integrated circuit packages having conductive elements such as pads/balls/pins in an array on a surface. Furthermore, additional structural and operational embodiments, including modifications/alterations, will become apparent to persons skilled in the relevant art(s) from the teachings herein.

Figure 3:
FIG. 3 shows a side cross-sectional view of an example package substrate.

Embodiments of the present invention may be implemented in substrates of integrated circuit packages, such as substrate 104 of BGA package 100. FIG. 3 shows a side cross-sectional view of an example of substrate 104. As shown in FIG. 3, substrate 104 includes a first (top) layer 302, a second layer 304, a third layer 306, a fourth layer 308, a fifth layer 310, a sixth layer 312, and a seventh (bottom) layer 314. In other implementations, substrate 104 may have alternative numbers of layers, including fewer layers or more layers than shown in FIG. 3. Layers 302-314 are shown in FIG. 3 as having similar thicknesses for illustrative purposes. In actual implementations, layers 302-314 typically may have various thicknesses.

Figure 4:
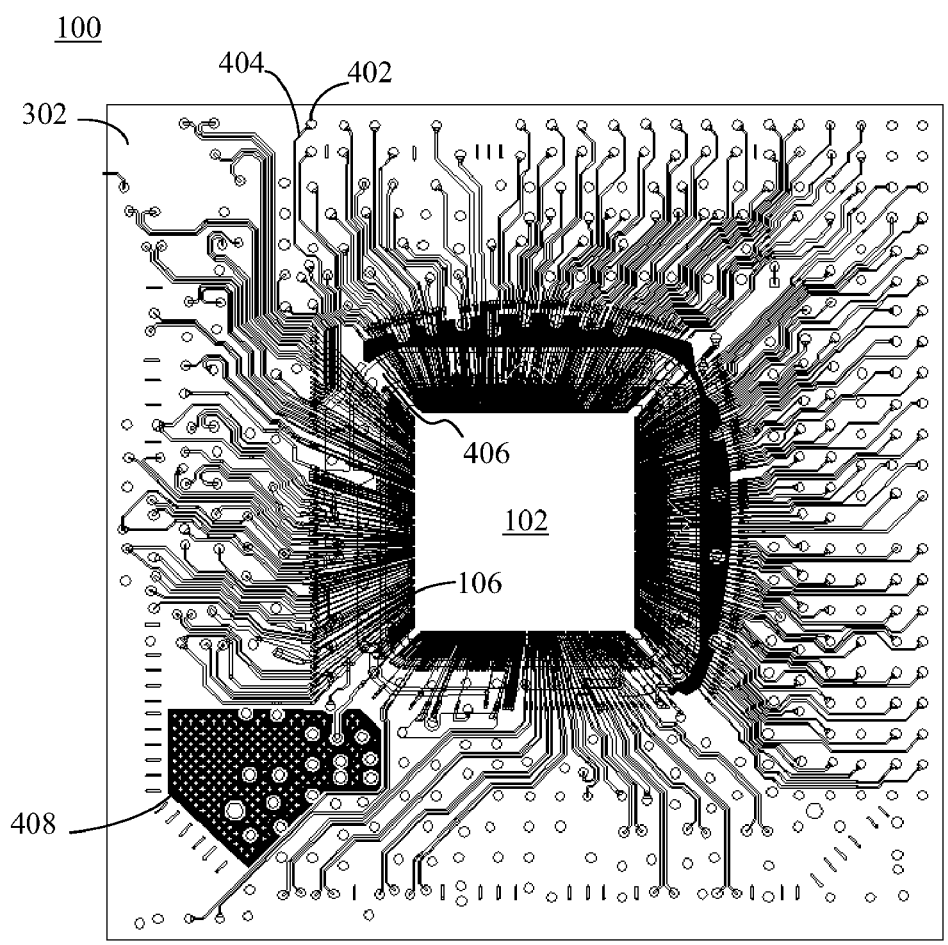
FIGS. 4-6 shows views of example layers of a package substrate.

In the example of FIG. 3, first layer 302 is an electrically conductive layer, including a plurality of electrically conductive features. First layer 302 may also be referred to as a signal layer. For example, FIG. 4 shows a top view of BGA package 100 such that a surface of first layer 302 is visible. In FIG. 4, die 102 is shown mounted centrally located on package 100, with a plurality of wirebonds 106 coupled between die 102 and electrically conductive features of first layer 302. The electrically conductive features of first layer 302 include vias 402, traces 404, a power ring 406 that surrounds the mount region of die 102, a ground region 408, and further electrically conductive features. Power, ground, and input/output signals are coupled from die 102 by wirebonds 106 to the electrically conductive features, to be coupled through substrate 104 by vias 402 to further of the layers of substrate 104.

Second, fourth, and sixth layers 304, 308, and 312 are electrically insulating layers. Layers 304, 308, and 312 may be made from ceramic, plastic, tape, and/or other suitable materials. For example, layers 304, 308, and 312 may be made from an organic material such as BT (bismaleimide triazine) laminate/resin, a flexible tape material such as polyimide, a flame retardant fiberglass composite substrate board material (e.g., FR-4), and/or further electrically insulating material. Layers 304, 308, and 312 have openings formed therethrough to enable respective power, ground, and input/output signals to be coupled through layers 304, 308, and 312 by vias 402.

Figure 5:
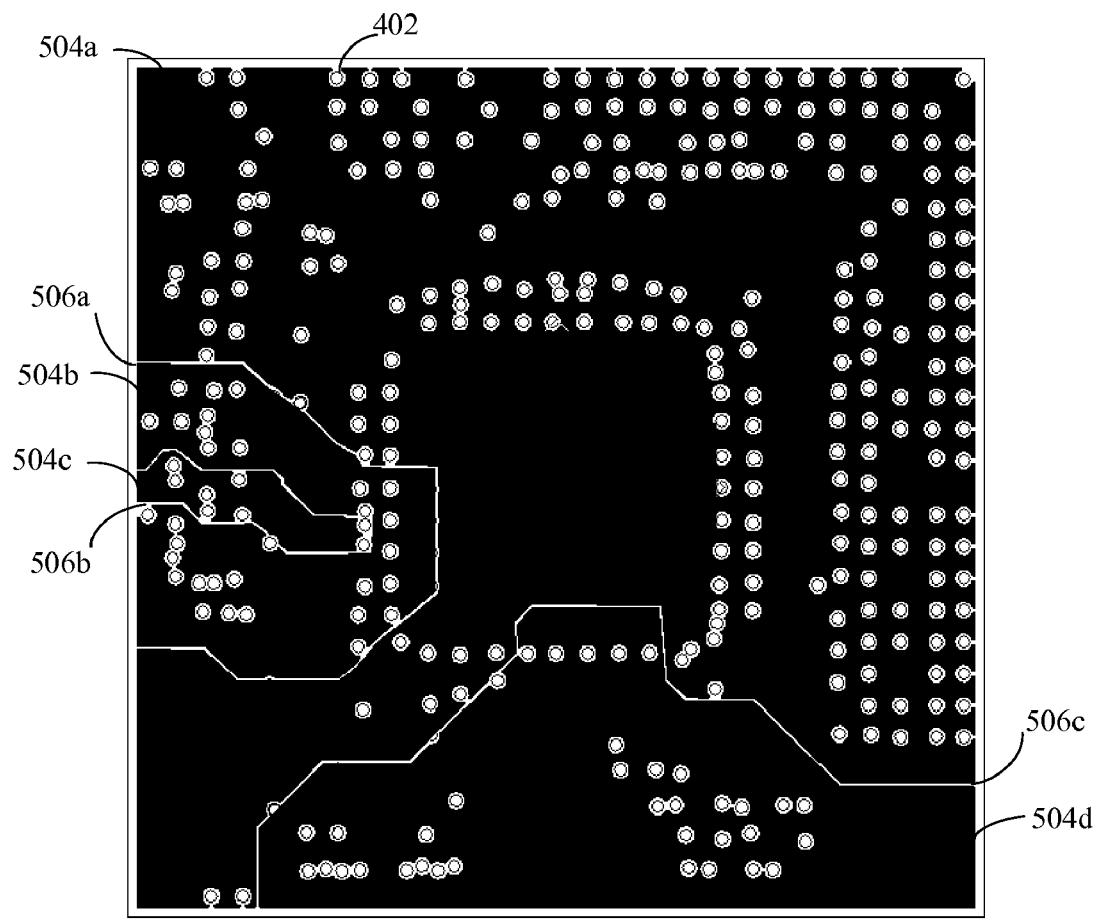

Third layer 306 is a ground layer, including one or more electrically conductive regions coupled to respective ground signals (e.g., one or more digital ground and/or analog ground signals). For example, FIG. 5 shows a view of third layer 306. Third layer includes a plurality of electrically conductive regions 504, including first-fourth electrically conductive regions 504a-504d. Electrically conductive regions 504a-504d are each coupled to a respective ground signal, and are electrically isolated from each other in third layer 306 (e.g., as indicated by separation lines 506a-506c).

Fifth layer 310 is a power layer, including one or more electrically conductive regions coupled to respective power signals (e.g., one or more digital power and/or analog power signals).

Figure 6:
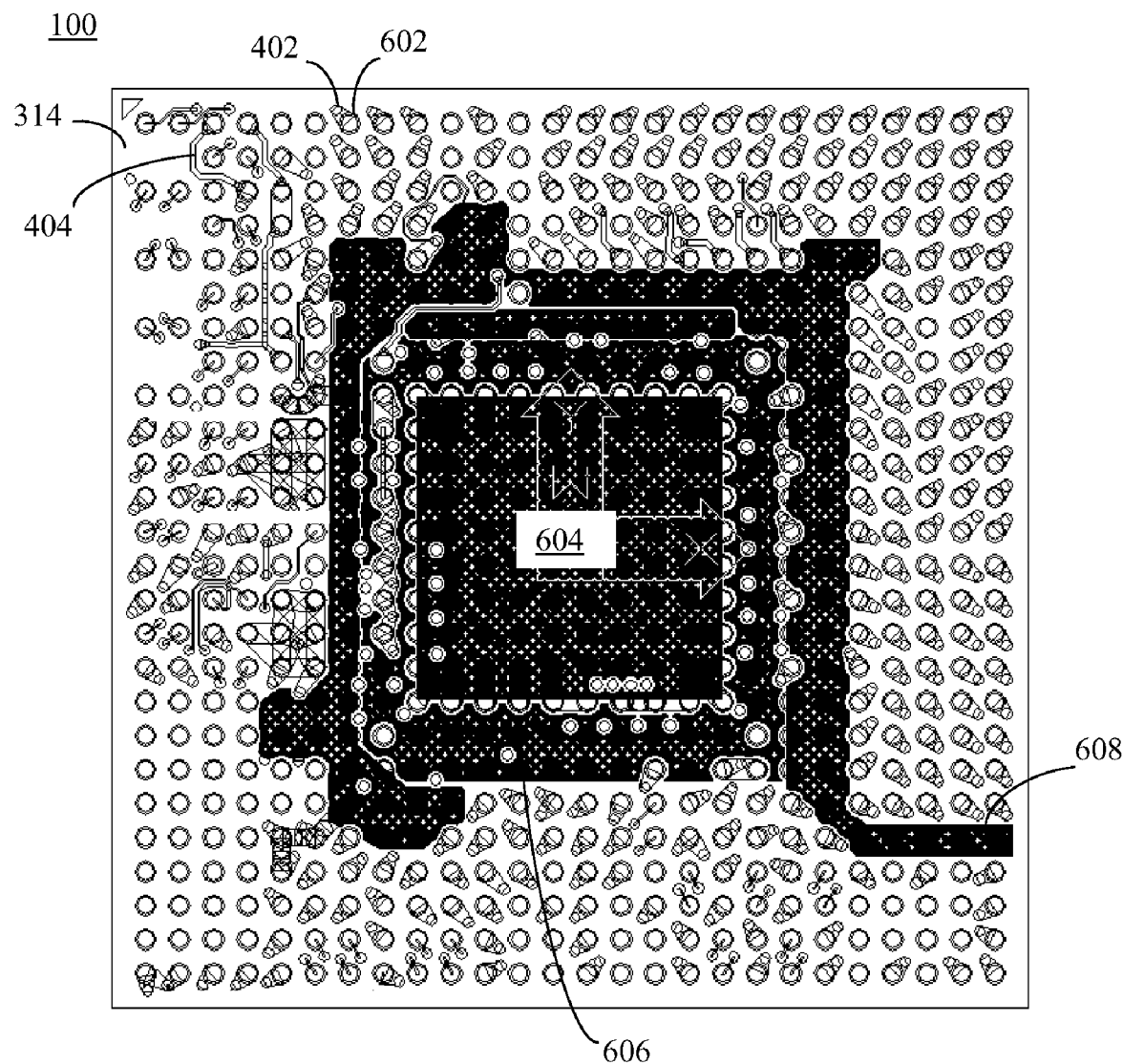

Seventh layer 314 is an electrically conductive layer, having a plurality of electrically conductive features, including an array of solder ball pads for attachment of solder balls. For example, FIG. 6 shows a bottom view of BGA package 100 such that a surface of seventh layer 314 is visible (solder balls 108 are not shown in FIG. 6). The electrically conductive features of seventh layer 314 include vias 402, traces 404, solder ball pads 602, a first ground region 604 corresponding to the mounting region for die 102 on first layer 302, a power ring 606 that surrounds first ground region 604, and a second ground region 608 that partially surrounds power ring 606. Signals may be coupled from first layer 302 by vias 402 to first ground region 604, power ring 606, second ground region 608, and solder ball pads 602 of seventh layer 314.

Note that layers 302, 306, and 314 in FIGS. 4-6 are shown for illustrative purposes, and are not intended to be limiting. Layers 302, 306, and 314 may include any number and combination of vias, traces, electrically conductive regions (e.g., power or ground rings, power or ground regions, etc.), and further electrically conductive features, as desired for a particular package implementation. Any number and arrangement of solder ball pads may be present on a surface of package 100, as desired for a particular package implementation.

Ground regions of substrate 104 that pertain to different ground signals are electrically isolated from each other in substrate 104. This may be required due to the different performance requirements of different circuit functional blocks of die 102, including a desire to prevent analog and digital ground paths from mixing. For example, as described above with respect to layer 306 in FIG. 5, electrically conductive regions 504a-504d are each coupled to a respective ground signal, and are electrically isolated from each other. However, when package 100 is mounted to a circuit board in an end product/application, the circuit board will typically electrically couple the different ground signals together. Thus, when package 100, including layer 306 of FIG. 5, is mounted to a circuit board, electrically conductive regions 504a-504d will be electrically coupled together. The electrical coupling of electrically conductive regions 504a-504d enables proper operation of package 100, and also provides some ESD protection for package 100.

A primary source of ESD protection for die 102 is typically provided in die 102. Due to the increasing number of functions and features in integrated circuit chips, ESD protection is very important to help ensure the quality of the final product. Because of the high cost of wafer development, and the risk that the primary on-die ESD protection might not properly function, a secondary form of ESD protection is desirable. The coupling together of electrically conductive regions 504a-504d in the circuit board to which package 100 is mounted provides a secondary source of ESD protection for die 102.

If package 100 is ESD tested while not being mounted to the circuit board, package 100 will be tested in a configuration that does not match its actual operating environment. In such a situation, electrically conductive regions 504a-504d will not be electrically coupled together during the ESD testing, and as a result, the secondary source of ESD protection provided by coupling together electrically conductive regions 504a-504d will not be present. Embodiments of the present invention enable selectable secondary ESD protection for integrated circuit packages that may be provided even if the package is not mounted to a circuit board.

Figure 7:
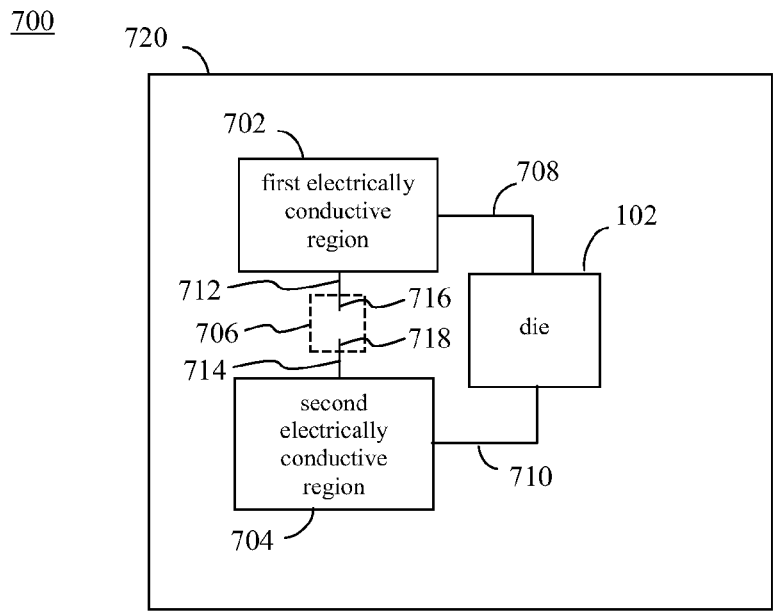
FIG. 7 shows a block diagram of a package substrate, according to an embodiment of the present invention.

For example, FIG. 7 shows a block diagram of an integrated circuit package 700, according to an embodiment of the present invention. As shown in FIG. 7, package 700 includes die 102 and a substrate 720. Depending on the particular integrated circuit package implementation, package 700 may include further features, such as solder balls, wirebonds, an encapsulating material, etc. Such additional features are not shown in FIG. 7, for ease of illustration and purposes of brevity. Substrate 720 includes a first electrically conductive region 702, a second electrically conductive region 704, a first electrically conductive trace 712, and a second electrically conductive trace. First electrically conductive region 702 is coupled to a first ground signal 708 of die 102, and second electrically conductive region 704 is coupled to a second ground signal 710 of die 102. First electrically conductive trace 712 is coupled to first electrically conductive region 702, and second electrically conductive trace 714 is coupled to second electrically conductive region 704. An end 716 of first electrically conductive trace 702 is proximate to an end 718 of second electrically conductive trace 714. In embodiments, first and second ground signals 708 and 710 may be selectively electrically coupled together to enable secondary ESD protection by depositing an electrically conductive material in a non-electrically conductive region 706 to couple end 716 of trace 712 and end 718 of trace 714. By enabling selective electrical coupling of ground signals to enable secondary ESD protection, various costs may be saved, including avoiding the need to produce a special purpose substrate to be used specifically to demonstrate ESD protection.

Figure 8:
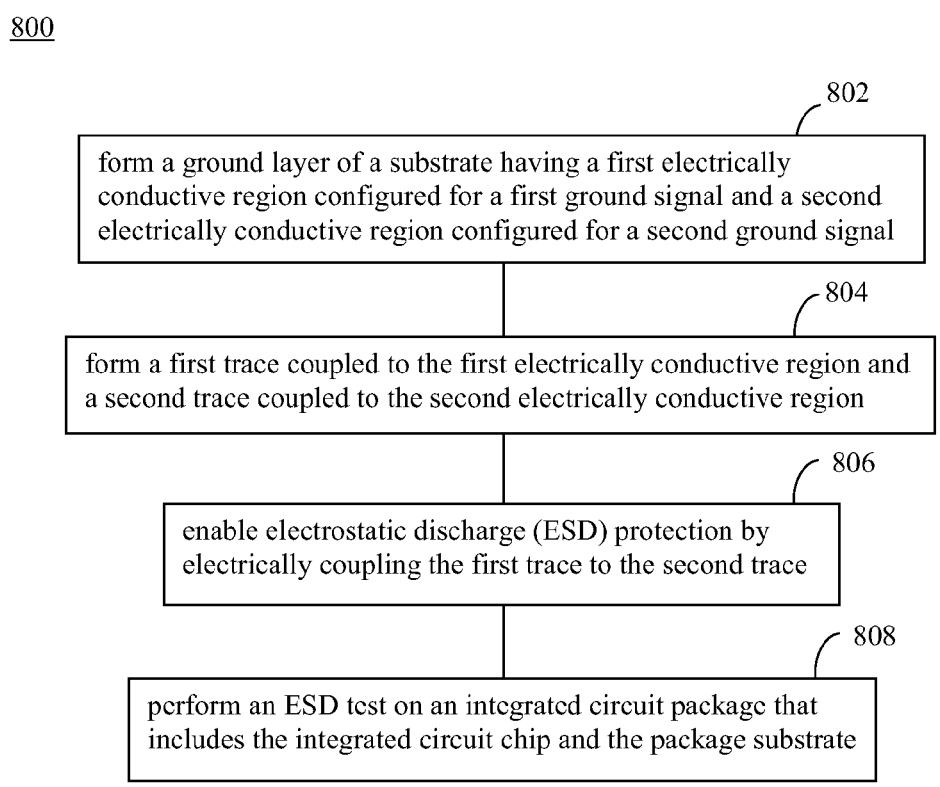
FIG. 8 shows a flowchart providing a process for forming a package substrate and for performing ESD testing, according to embodiments of the present invention.

FIG. 8 shows a flowchart 800 providing a process for forming a package substrate and performing ESD testing, according to embodiments of the present invention. Flowchart 800 is described with respect to package 700 shown in FIG. 7, for illustrative purposes. Not all steps of flowchart 800 must be performed in all embodiments. For example, steps 802 and 804 may be performed during a process for forming a package substrate. Step 806 may optionally be performed during a process for forming a package substrate. In another example, steps 806 and 808 may be performed during a process for ESD testing a package. Other structural and operational embodiments will be apparent to persons skilled in the relevant art(s) based on the discussion regarding flowchart 800. Flowchart 800 is described as follows.

Flowchart 800 begins with step 802. In step 802, a ground layer of a substrate is formed having a first electrically conductive region configured for a first ground signal and a second electrically conductive region configured for a second ground signal. For example, in step 802, a ground layer such as third layer 306 shown in FIGS. 3 and 5 may be formed. As shown in FIG. 5, third layer 306 has electrically conductive regions 504a-504d that are each configured for a respective ground signal. In another example, first and second electrically conductive regions 702 and 704 shown in FIG. 7 are configured for first and second ground signals 708 and 710, respectively. In embodiments, electrically conductive regions 504 can all reside on the same substrate layer, or can be distributed across multiple substrate layers.

In step 804, a first trace is formed that is coupled to the first electrically conductive region, and a second trace is formed that is coupled to the second electrically conductive region. For example, as shown in FIG. 7, first electrically conductive trace 712 is formed, and is coupled to first electrically conductive region 702. Second electrically conductive trace 714 is formed, and is coupled to second electrically conductive region 704.

Traces 712 and 714 may be formed using any suitable electrically conductive material, including a metal or combination of metals/alloy, such as copper, aluminum, tin, nickel, gold, silver, or other electrically conductive material mentioned elsewhere herein or otherwise known. Traces 712 and 714 may have any width, including a width similar to widths of other traces (e.g., traces 404) of the substrate, or narrower than such traces. Such trace widths provide traces 712 and 714, when electrically connected together, with a higher resistance relative to that of electrically conductive regions 702 and 704. Thus, returns of analog and/or digital signals that normally pass through electrically conductive regions 702 and 704 will not be substantially affected. Furthermore, traces 712 and 714 may have any length, and may be straight traces or may include any number of corners/turns, as desired.

Note that steps 802 and 804 may be performed as a portion of a process for forming a package substrate, such as substrate 104 described above. Processes for forming package substrates are well known to person skilled in the relevant art(s). In one embodiment, first and second electrically conductive regions 702 and 704 and first and second traces 712 and 714 may all be formed in a single substrate layer, such as a ground layer. Thus, in such an embodiment, steps 802 and 804 may be performed simultaneously. Alternatively, first and second electrically conductive regions 702 and 704 may be formed in one or more substrate layers that is/are separate from a substrate layer in which first and second traces 712 and 714 are formed. Thus, in such an embodiment, steps 802 and 804 may be performed separately.

Figure 9:
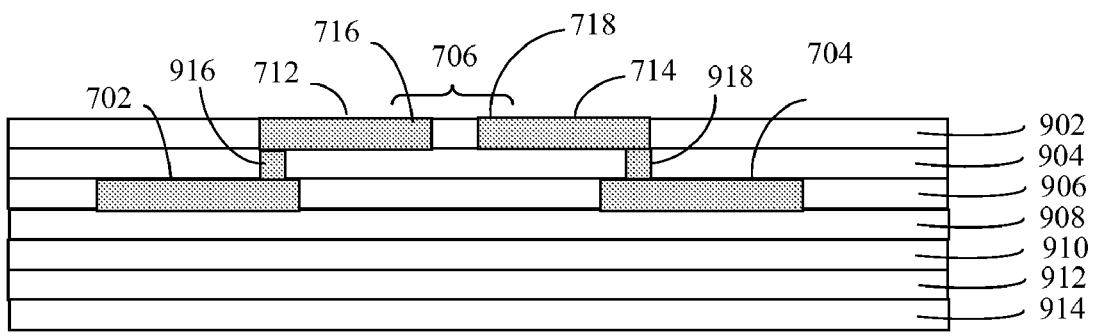
FIG. 9 shows a cross-sectional view of a substrate, according to an example embodiment of the present invention.

For example, FIG. 9 shows a cross-sectional view of a substrate 900, according to an example embodiment of the present invention. Similarly to substrate 104 shown in FIG. 3, substrate 900 includes a stack of seven layers, including a first (top) layer 902, a second layer 904, a third layer 906, a fourth layer 908, a fifth layer 910, a sixth layer 912, and a seventh (bottom) layer 914 (substrate 900 may have alternative numbers of layers than shown in FIG. 9). In the example of FIG. 9, first and second electrically conductive regions 702 and 704 are formed in third layer 906, and first and second traces 712 and 714 are formed in first layer 902. For example, first layer 902 may be a signal layer, and third layer 906 may be a ground layer, similar to the configuration of substrate 104 shown in FIG. 3. First trace 712 is electrically coupled to first electrically conductive region 702 by an electrically conductive via 916. Second trace 714 is electrically coupled to second electrically conductive region 704 by an electrically conductive via 918. Traces 712 and 714 may be electrically coupled to first and second electrically conductive regions 702 and 704, respectively, through any number of vias and/or further electrically conductive features, as desired for a particular implementation.

Figure 10:
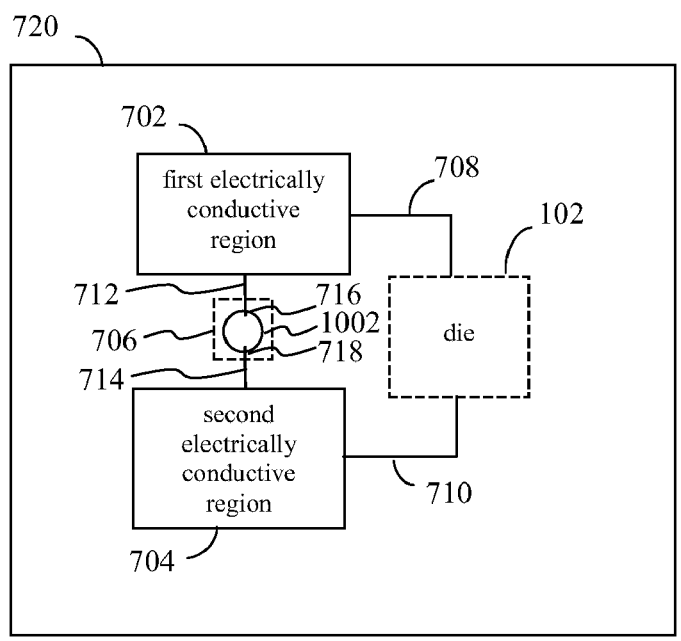
FIG. 10 shows the package substrate of FIG. 7 with an electrically conductive material that electrically connects a pair of traces, according to an embodiment of the present invention.

In step 806, electrostatic discharge (ESD) protection is enabled by electrically coupling the first trace to the second trace. In an example embodiment, ESD protection is enabled by electrically coupling together first and second traces 712 shown in FIG. 7. An electrically conductive material may be deposited on substrate 720 at non-electrically conductive region 706 to electrically couple end 716 of trace 712 and end 718 of trace 714. For instance, FIG. 10 shows package 700, with substrate 720 having an electrically conductive material 1002 deposited in region 706, according to an embodiment of the present invention. Electrically conductive material 1002 is deposited in region 706 to electrically connect end 716 of trace 712 to end 718 of trace 714, thereby electrically coupling first and second electrically conductive regions 702 and 704. In this manner, the ground signals of first and second electrically conductive regions 702 and 704 are electrically coupled in a similar manner to how they would be electrically coupled by a circuit board to which package 700 is mounted, and ESD testing can therefore be performed on package 700 in a configuration similar to an actual operating environment.

Electrically conductive material 1002 may be any type of electrically conductive material, such as copper, aluminum, gold, silver, iron, other metal, or a combination of metals/alloy. Electrically conductive material 1002 may be a solder, including a solder paste, a wirebond, or other electrically conductive element that may be applied to substrate in liquid or solid form. Electrically conductive material 1002 may have any shape on substrate 720. For example, electrically conductive material 1002 may have a round, rectangular, other polygon, irregular, or other shape on substrate 720. In an embodiment, region 706 is formed on substrate 720 as an area of substrate (e.g., of a top or bottom layer) as an opening in a solder mask material patterned on substrate 720. Because the solder mask material is not present in region 706, solder may be applied to, and adhere to region 706, as electrically conductive material 1002. The solder mask opening at region 720 may be patterned when the solder mask material is originally applied to substrate 720, or the solder mask opening at region 720 may be formed by removing (e.g., etching away) solder mask material that has already been applied to substrate 720.

In step 808, an ESD test is performed on an integrated circuit package that includes the integrated circuit chip and the package substrate. As described above, ESD testing can be performed on package 700 in a configuration similar to an actual operating environment subsequent to step 806. ESD tests that may be performed in step 808 will be well known to persons skilled in the relevant art(s).

Note that steps 806 and 808 do not need to be performed if ESD testing is not to be performed on the resulting package. Thus, steps 802 and 804 may be performed, forming traces 714 and 716, while leaving ESD protection disabled in the resulting package by not coupling together traces 714 and 716.

In an embodiment, subsequent to step 808, electrically conductive material 1002 may optionally be removed from region 706, to de-couple (electrically) traces 712 and 714, such that first and second electrically conductive regions 702 and 704 are no longer electrically coupled together. After removal of electrically conductive material 1002, package 700 may be implemented in an end product/device.

Figure 11:
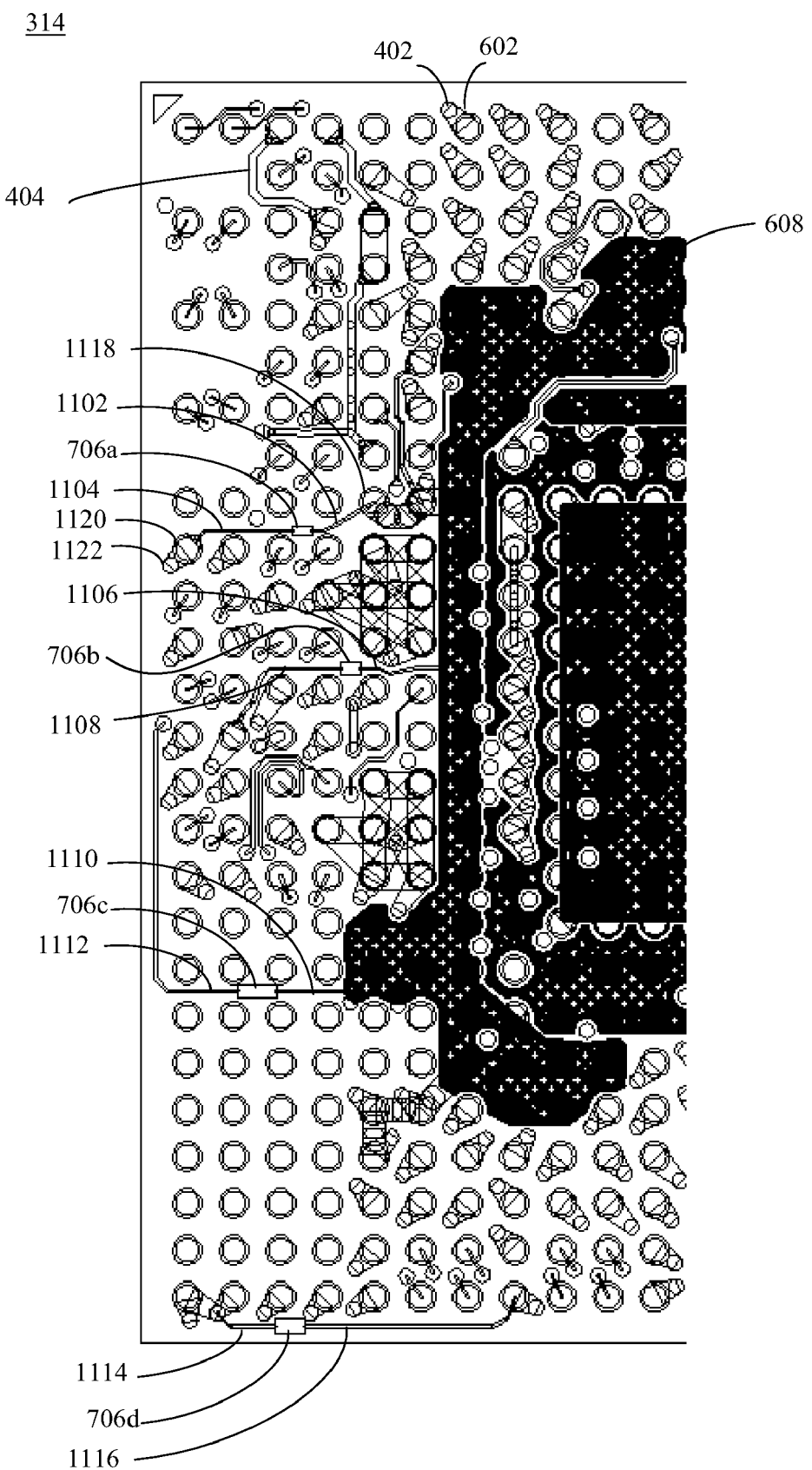
FIG. 11 shows a portion of the substrate layer shown in FIG. 6 modified to enable ESD testing, according to an example embodiment of the present invention.

FIG. 11 illustrates an example embodiment of the present invention. FIG. 11 shows a portion of seventh layer 314 of FIG. 6 modified to enable ESD testing, according to an example embodiment of the present invention. As shown in FIG. 11, seventh layer 314 includes first-fourth regions 706a-706d. For example, in an embodiment, first-fourth regions 706a-706d may openings in a solder mask material patterned on layer 314. An end of a first trace 1102 and an end of a second trace 1104 are present in region 706a. First trace 1102 is electrically coupled to a solder ball pad 1118, which is electrically coupled to second ground region 608, and second trace 1102 is electrically coupled to a solder ball pad 1120, which is coupled to electrically conductive region 504b (shown in FIG. 5) through a via 1122. By depositing an electrically conductive material in region 706a, traces 1102 and 1104 may be electrically connected, thereby electrically coupling the ground signals of ground region 608 and electrically conductive region 504b. In a similar manner, further ground signals of substrate 104 (of FIG. 3) may be coupled together by depositing electrically conductive material in regions 706b-706d of layer 314 in FIG. 11. An electrically conductive material may be deposited in region 706b to electrically couple ground signals associated with a third trace 1106 and a fourth trace 1108. An electrically conductive material may be deposited in region 706c to electrically couple ground signals associated with a fifth trace 1110 and a sixth trace 1112. An electrically conductive material may be deposited in region 706d to electrically couple ground signals associated with a seventh trace 1114 and an eighth trace 1116. Any number of ground signals may be electrically coupled in this manner, in embodiments of the present invention.

In the embodiment of FIG. 11, note that electrically conductive material may be deposited in all of regions 706a-706d to couple together all involved ground signals, or electrically conductive material may be deposited in fewer than all of regions 706a-706d to couple together selected ground signals (not all ground signals). For example, fewer than all ground signals may be coupled together in this manner to aid in a chip debugging process, and/or in other situations, for example.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit package, comprising:
an integrated circuit chip;
a substrate having a first layer and a second layer separated by at least one electrically isolating layer;
a first electrically conductive trace;
a second electrically conductive trace, the first and second electrically conductive traces being contained in a common layer of the substrate and being routed in the common layer in parallel with the electrically isolating layer; and
a solder mask layer that substantially covers the first layer;
wherein the first layer includes a plurality of electrically conductive features;

wherein the second layer is a ground layer that includes a first electrically conductive region and a second electrically conductive region, the first and second electrically conductive regions being electrically isolated from each other;

wherein the first electrically conductive region is coupled to a first ground signal of the chip, and the second electrically conductive region is coupled to a second ground signal of the chip;

wherein the first electrically conductive trace is coupled to the first electrically conductive region and the second electrically conductive trace is coupled to the second electrically conductive region, and a portion of the first electrically conductive trace is proximate to a portion of the second electrically conductive trace, the first and second electrically conductive traces being configured to be selectively electrically coupled together to electrically couple together the first and second ground signals;

wherein the first and second electrically conductive traces are in the first layer; and wherein the solder mask layer has an opening that overlaps the portion of the first electrically conductive trace and the portion of the second electrically conductive trace.

2. A substrate for an integrated circuit package, comprising:

a first layer that includes a plurality of electrically conductive features;

a second layer that is a ground layer that includes a first electrically conductive region and a second electrically conductive region, the first and second electrically conductive regions being electrically isolated from each other;

at least one electrically isolating layer between the first layer and the second layer;

a first electrically conductive trace;

a second electrically conductive trace, the first and second electrically conductive traces being contained in a common layer of the substrate and being routed in the common layer in parallel with the electrically isolating layer; and a solder mask layer that substantially covers the first layer;

wherein the first electrically conductive region is configured to be coupled to a first ground signal, and the second electrically conductive region is configured to be coupled to a second ground signal;

wherein the first electrically conductive trace is coupled to the first electrically conductive region and the second electrically conductive trace is coupled to the second electrically conductive region, and a portion of the first electrically conductive trace is proximate to a portion of the second electrically conductive trace, the first and second electrically conductive traces being configured to be coupled together to electrically couple together the first and second ground signals;

wherein the first and second electrically conductive traces are in the first layer; and wherein the solder mask layer has an opening that overlaps the portion of the first electrically conductive trace and the portion of the second electrically conductive trace.

3. An integrated circuit package, comprising:
an integrated circuit chip;
a substrate having a first layer and a second layer separated by at least one electrically isolating layer;
an electrically conductive material;
a first electrically conductive trace; and
a second electrically conductive trace, the first and second electrically conductive traces being contained in a common layer of the substrate and being routed in the common layer in parallel with the electrically isolating layer;

wherein the first layer includes a plurality of electrically conductive features;

wherein the second layer is a ground layer that includes a first electrically conductive region and a second electrically conductive region;

wherein the first electrically conductive region is coupled to a first ground signal of the chip, and the second electrically conductive region is coupled to a second ground signal of the chip;

wherein the first electrically conductive trace is coupled to the first electrically conductive region and the second electrically conductive trace is coupled to the second electrically conductive region, and a portion of the first electrically conductive trace is proximate to a portion of the second electrically conductive trace; and wherein the electrically conductive material is deposited on the first layer to electrically couple the portion of the first electrically conductive trace and the portion of the second electrically conductive trace to electrically couple the first and second ground signals together.

4. The package of claim 3, wherein the first and second electrically conductive traces are in the first layer.

5. The package of claim 4, further comprising:
a solder mask layer that substantially covers the first layer; and
an opening in the solder mask layer that overlaps the portion of the first electrically conductive trace and the portion of the second electrically conductive trace.

6. The package of claim 4, wherein the electrically conductive material is deposited on the first layer at the opening.

7. The package of claim 6, wherein the deposited electrically conductive material enables electrostatic discharge (ESD) protection testing of the package.

8. The package of claim 3, wherein the first and second electrically conductive traces are in the second layer.

9. A substrate for an integrated circuit package, comprising:
a first layer that includes a plurality of electrically conductive features;
a second layer that is a ground layer that includes a first electrically conductive region and a second electrically conductive region;
at least one electrically isolating layer between the first layer and the second layer;
an electrically conductive material;
a first electrically conductive trace; and
a second electrically conductive trace, the first and second electrically conductive traces being contained in a common layer of the substrate and being routed in the common layer in parallel with the electrically isolating layer;

wherein the first electrically conductive region is configured to be coupled to a first ground signal, and the second electrically conductive region is configured to be coupled to a second ground signal;

wherein the first electrically conductive trace is coupled to the first electrically conductive region and the second electrically conductive trace is coupled to the second electrically conductive region, and a portion of the first electrically conductive trace is proximate to a portion of the second electrically conductive trace; and wherein the electrically conductive material is deposited on the first layer to electrically couple together the portion of the first electrically conductive trace and the portion of the second electrically conductive trace to electrically couple the first and second ground signals together.

10. The substrate of claim 9, wherein the first and second electrically conductive traces are in the first layer.

11. The substrate of claim 10, further comprising:
a solder mask layer that substantially covers the first layer; and
an opening in the solder mask layer that overlaps the portion of the first electrically conductive trace and the portion of the second electrically conductive trace.

12. The substrate of claim 11, wherein the electrically conductive material is deposited on the first layer at the opening.

13. The substrate of claim 12, wherein the deposited electrically conductive material enables electrostatic discharge (ESD) protection testing of an integrated circuit package in which the substrate may be positioned.

14. The substrate of claim 9, wherein the first and second electrically conductive traces are in the second layer.

15. The package of claim 1, wherein the first electrically conductive trace has a width that is narrower than a width of a third electrically conductive trace contained in the common layer of the substrate.

16. The package of claim 1, further comprising:
an array of solder balls on a surface of the substrate.

17. The substrate of claim 2, wherein the first electrically conductive trace has a width that is narrower than a width of a third electrically conductive trace contained in the common layer of the substrate.

18. The package of claim 3, wherein the first electrically conductive trace has a width that is narrower than a width of a third electrically conductive trace contained in the common layer of the substrate.

19. The package of claim 3, further comprising:
an array of solder balls on a surface of the substrate.

20. The package of claim 3, wherein the electrically conductive material includes at least one of a solder or a wirebond.

21. The substrate of claim 9, wherein the first electrically conductive trace has a width that is narrower than a width of a third electrically conductive trace contained in the common layer of the substrate.

22. The substrate of claim 9, wherein the electrically conductive material includes at least one of a solder or a wirebond.

\* \* \* \* \*